United States Patent
Francisquini

(10) Patent No.: US 12,249,811 B2
(45) Date of Patent: Mar. 11, 2025

(54) PROFILE FOR ELECTRICAL CABINET

(71) Applicant: Melquisedec Francisquini, São Paulo (BR)

(72) Inventor: Melquisedec Francisquini, São Paulo (BR)

( * ) Notice: Subject to any disclaimer, the term of this patent is extended or adjusted under 35 U.S.C. 154(b) by 695 days.

(21) Appl. No.: 17/614,109

(22) PCT Filed: May 26, 2020

(86) PCT No.: PCT/BR2020/050182
§ 371 (c)(1),
(2) Date: Nov. 24, 2021

(87) PCT Pub. No.: WO2020/237336
PCT Pub. Date: Dec. 3, 2020

(65) Prior Publication Data
US 2022/0320837 A1    Oct. 6, 2022

(30) Foreign Application Priority Data

May 28, 2019    (BR) .................. 10 2019 010954-8

(51) Int. Cl.
*H02B 1/01*    (2006.01)
*H02B 1/30*    (2006.01)

(52) U.S. Cl.
CPC .............. *H02B 1/013* (2013.01); *H02B 1/014* (2013.01); *H02B 1/301* (2013.01)

(58) Field of Classification Search
CPC .......... H02B 1/014; H02B 1/28; H02B 1/301; H02B 1/013; H02B 1/01; H02B 1/308; H05K 7/183; H05K 7/1488; A47B 47/03; A47B 96/1408; A47B 96/1433; A47B 96/1458

USPC ....................................................... 312/265.1
See application file for complete search history.

(56) References Cited

U.S. PATENT DOCUMENTS

| | | | | |
|---|---|---|---|---|
| 4,643,319 A | * | 2/1987 | Debus ...................... | H02B 1/01 361/829 |
| 5,202,818 A | * | 4/1993 | Betsch ................... | H02B 1/301 361/829 |
| 5,992,646 A | * | 11/1999 | Benner .................. | H05K 7/183 312/265.3 |

(Continued)

FOREIGN PATENT DOCUMENTS

| | | |
|---|---|---|
| BR | 0201155 A | 12/2003 |
| BR | 0301083 A | 11/2004 |

(Continued)

OTHER PUBLICATIONS

JP 2002280770 translation (Year: 2002).*

(Continued)

*Primary Examiner* — Hiwot E Tefera
(74) *Attorney, Agent, or Firm* — Vorys, Sater, Seymour and Pease LLP; Mark A. Watkins

(57) ABSTRACT

"PROFILE FOR ELECTRICAL CABINET" presents an invention that falls within the field of application of metal profiles for structural elements, more precisely in the field of metal profiles to electrical cabinets and enclosures. A profile having a side sealing area and, located in its relation, preferably at 90°, a front sealing area; an inner wall, a rear wall, an outer wall, an oblique wall and an isolating wall.

15 Claims, 3 Drawing Sheets

(56) References Cited

U.S. PATENT DOCUMENTS

| | | | |
|---|---|---|---|
| 6,149,255 A * | 11/2000 | Benner | H02B 1/303 |
| | | | 312/265.4 |
| 6,231,142 B1 | 5/2001 | Pochet | |
| 6,808,240 B2 | 10/2004 | Altena | |
| 9,871,353 B2 * | 1/2018 | Boehme | H05K 7/183 |
| 2001/0050516 A1 * | 12/2001 | Minoura | H02B 1/308 |
| | | | 312/223.1 |
| 2002/0121387 A1 * | 9/2002 | Suzuki | H02B 1/01 |
| | | | 174/50 |
| 2004/0004418 A1 * | 1/2004 | Wyatt | H05K 7/183 |
| | | | 312/265.1 |
| 2007/0175648 A1 * | 8/2007 | Francisquini | H02B 1/01 |
| | | | 174/50 |
| 2013/0221813 A1 | 8/2013 | Maisch | |
| 2016/0352080 A1 * | 12/2016 | Brueck | H02B 1/013 |
| 2016/0352083 A1 * | 12/2016 | Brueck | H02B 1/308 |
| 2018/0116400 A1 * | 5/2018 | Lu | H05K 7/1488 |
| 2018/0375302 A1 * | 12/2018 | Reuter | H02B 1/013 |
| 2021/0235863 A1 * | 8/2021 | Francisquini | H05K 7/18 |

FOREIGN PATENT DOCUMENTS

| | | | | |
|---|---|---|---|---|
| JP | 2002280770 A | * | 9/2002 | H02B 1/01 |
| JP | 2002319778 A | * | 10/2002 | H02B 1/01 |
| WO | 0305552 A2 | | 12/2003 | |
| WO | 2015117597 A1 | | 8/2015 | |
| WO | 2017092727 A1 | | 6/2017 | |

OTHER PUBLICATIONS

International Search Report and Written Opinion from related International Application PCT/BR2020/050182, mail date Nov. 8, 2020, Authorized Officer Rafael Da Rolt D'agostini. Form PCT/ISA/210. Eight (8) pages.

* cited by examiner

FIG. 4
FIG. 5
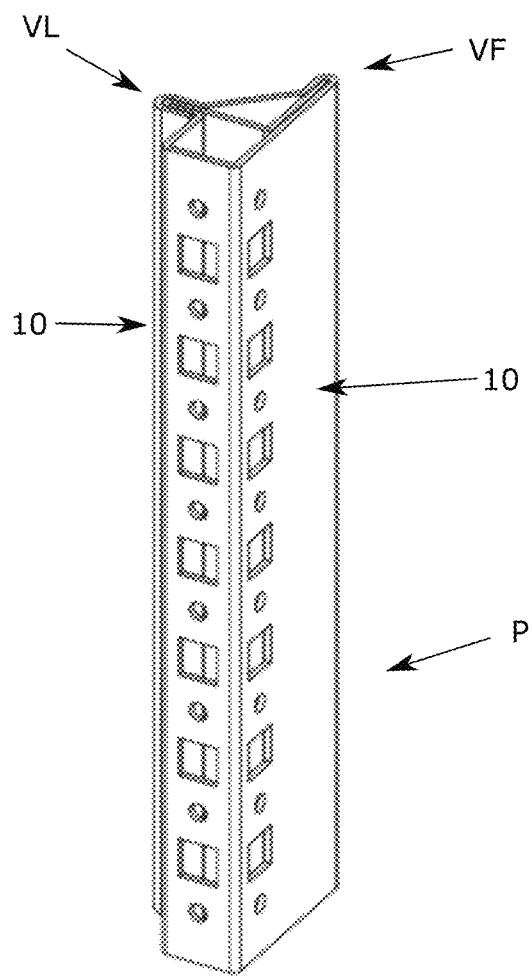
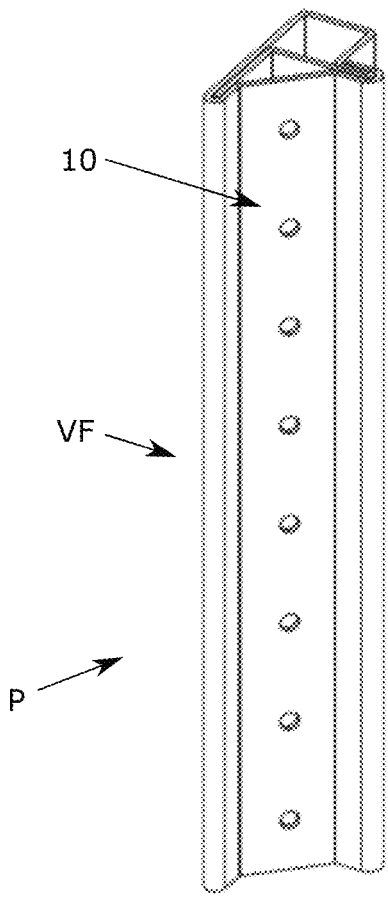

PROFILE FOR ELECTRICAL CABINET

CROSS-REFERENCE TO RELATED APPLICATIONS

This application claims priority to International Patent Application No. PCT/BR2020/050182 filed May 26, 2020, and Brazil Patent Application No. BR 10 2019 010954-8 filed May 28, 2019, the entire disclosures of which are fully incorporated herein by reference in their entirety.

FIELD OF THE INVENTION

The present invention is comprised in the field of application of metal profiles for structural elements, more precisely in the field of metal profiles for electrical cabinets and enclosures.

BACKGROUND OF THE INVENTION

Electrical cabinets and enclosures are widely used in industry. Their basic functions consist in providing a useful area for electrical and electronic component assembly, preventing no permitted access by unauthorized people to these components and in some cases, protecting such electrical and electronic components against dust and external moisture.

Several types of structure are used in the construction of electrical cabinets such as welded, merged, tubular and metal profile structures. The metal profiles are presented as an important construction form, being quite used in cabinet manufacturing by presenting easy handling, since they are effortlessly transported and assembled in the installation site.

Considering their industrial application and the high currents and voltages to which they are subjected, some electrical cabinets have series of safety standards, which aim to certify their ability to withstand possible short circuits, without propagating flames or exploding. Thus, the metal profiles, together with the other elements that form the electrical cabinet structure, must be able to promote the isolation of the electrical cabinet interior from the external environment.

Another important characteristic in electrical cabinet profiles is the occupied space. The greater the space occupied by the profile, the smaller the useful area for assembling the components. Thereby, in addition to meeting component assembly needs and providing a solid and stable structure, it is important that the profile is compact and provides the largest possible useful area.

The prior art presents profiles with different shapes and characteristics. Among them, one can cite those described in the documents U.S. Pat. Nos. 6,231,142, 6,808,240, WO2003105552 and WO2015117597.

Document U.S. Pat. No. 6,231,142 presents a complex format profile, with several edges which makes its construction difficult. In addition, said profile presents several curves and changes in the direction of its sides, which occupy a large space and, consequently, make the useful area in the cabinet smaller. Another problem relates to the cabinet presented in that document wherein its sealing can be compromised by the holes for fastening, which consequently can cause infiltrations.

Document WO2015117597 presents a quite simple profile; however, if it is made of folded sheet metal, there will be a need for welding to provide structural rigidity. Another problem of the profile is in its sealing areas, which are narrow and, consequently, may cause infiltrations. The profile presented in that document has a problem of structural fragility, due to the absence of internal elements that give rigidity to said profile, and such fragility leads to the need of using a larger profile, which consequently reduces the useful area inside the cabinet.

Therefore, it is possible to demonstrate that the solutions presented in the prior art do not fully solve the condition of providing an easy-to-manufacture metal profile. Moreover, they fail to offer a profile that occupies the least amount of space possible and, consequently, offers the greatest useful area inside the cabinet. Finally, they fail to offer a profile that provides total isolation between the internal and external areas.

BRIEF DESCRIPTION OF THE INVENTION

The present invention refers to an easy-to-manufacture metal profile, with its own geometry and high structural rigidity, which allows its use with a smaller width, offering, thus, a greater useful assembly area inside the cabinet.

An objective of the present invention is to offer a metal profile capable of presenting a high isolation degree between the internal and external areas of the electrical cabinet.

Another objective of the present invention is to offer a metal profile of simple and low-cost manufacture.

One more objective of the present invention is to offer a profile that presents an easy assembly of the components.

And finally, another objective of the present invention is to offer a metal profile that occupies less space, thus presenting a greater useful area inside the cabinet.

BRIEF DESCRIPTION OF THE DRAWINGS

The subject matter of this specifications will be totally evident in its technical aspects from the detailed description that will be made based on the figures listed below, in which:

FIG. 4 shows a rear perspective view of an embodiment of the profile, where it is possible to observe the fastening means of the internal components;

FIG. 5 shows a perspective view of an embodiment of the profile, wherein the fastening means of the external components on the oblique wall are observed.

DETAILED DESCRIPTION OF THE INVENTION

Figure 1:
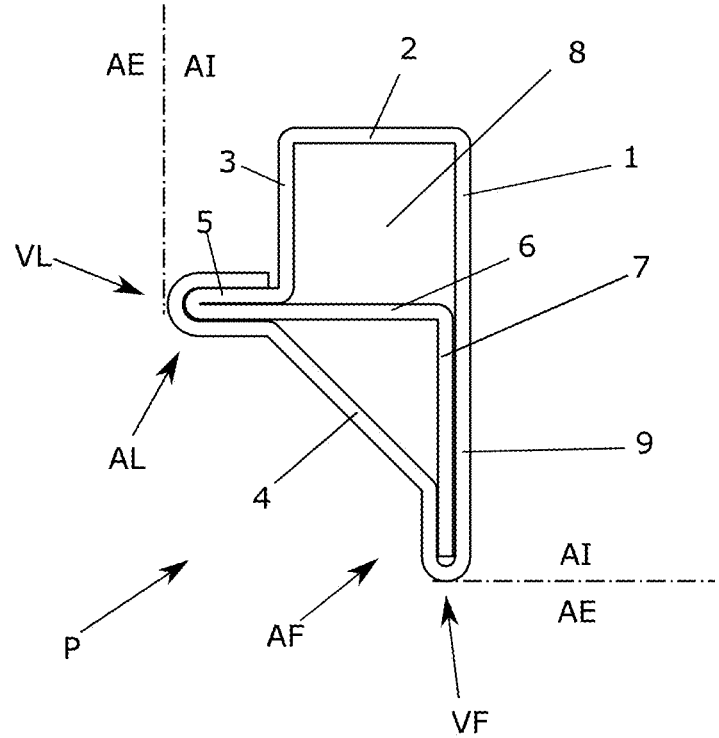
FIG. 1 shows a top view of an embodiment of the profile, where it is possible to observe the construction in single folded sheet with overlapping layers.
Figure 2:
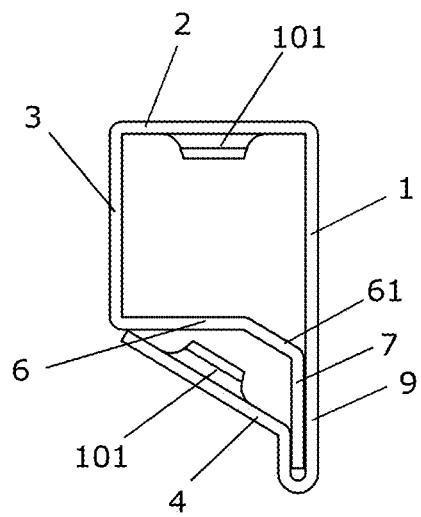
FIG. 2 shows a top view of another embodiment of the profile, where it is possible to observe the construction in single folded sheet with overlapping layers and the hole deep draws.
Figure 3:
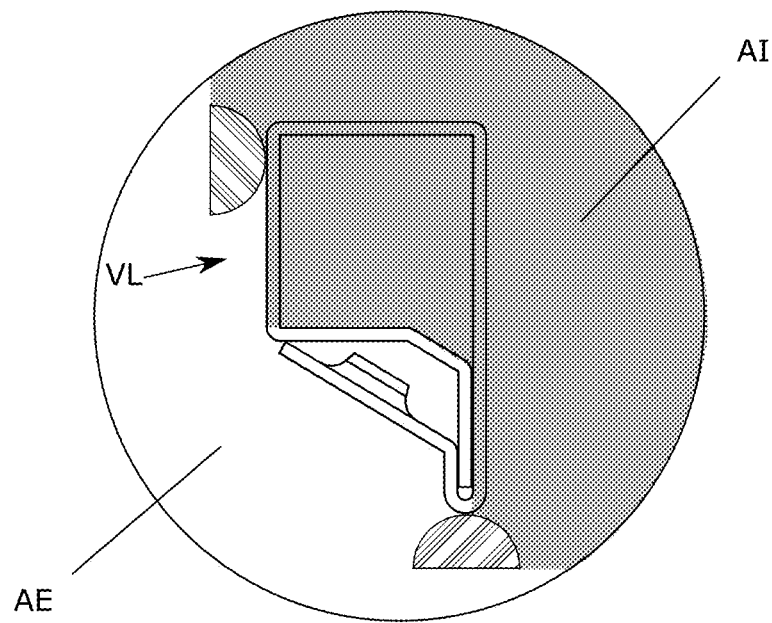
FIG. 3 shows a top view of an embodiment of the profile, where it is possible to observe the separation between the internal and external areas provided by the profile.
Figure 6:
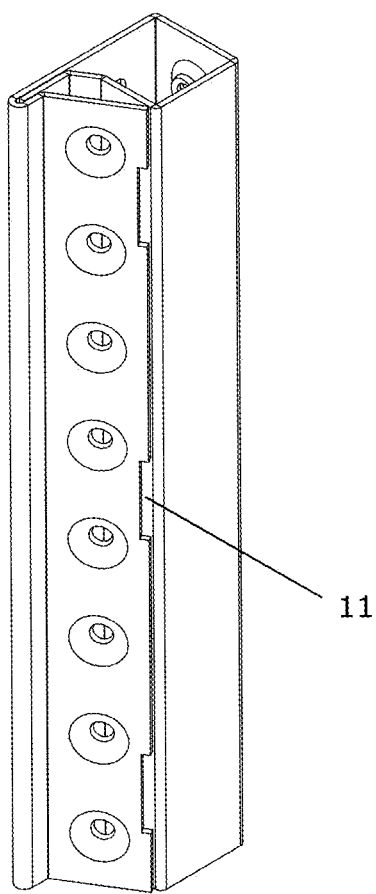
FIG. 6 shows a perspective view of an embodiment of the profile, where it is possible to observe the hole deep draws characterized as a fastening mean and the cutout for performing the weld on the oblique wall.

In accordance with the mentioned figures, the present invention PROFILE FOR ELECTRICAL CABINET comprises the profile (P) that has a side sealing area (VL) and positioned in relation to this, preferably at 90°, a front sealing area (VF), an inner wall (1), a rear wall (2), an outer wall (3), an oblique wall (4) and an isolating wall (6).

The inner wall (1) is connected to the rear wall (2) forming an angle of 90° with each other. At the opposite end to the inner wall (1), said rear wall (2) is connected to the outer wall (3) which is parallel to the inner wall (1).

Connected to the outer wall (3), at the opposite end to the rear wall (2) and away from the inner wall (1), is a reinforcing tab (5). Said reinforcing tab (5) bends at an angle of 180° and has one of its sides connected to the outer wall (3) and the other side is connected to the isolating wall (6).

Said isolating wall (6) is aligned to one of the sides of the reinforcing tab (5) and goes towards the inner wall (1) until they touch each other.

An initial crimping tab (7) connects to the isolating wall (6) at the end that is next to the inner wall (1). Said initial crimping tab (7) goes next to a junction wall (9), said junction wall (9) being an extension of the inner wall (1).

A front tab (AF) has a "U" shape and is located around the end of the initial crimping tab (7). Said front tab (AF) has one of its sides connected to the junction wall (9) and the other side connected to the oblique wall (4). The front tab (AF) has a front sealing area (VF) at its curved portion.

The oblique wall (4) goes towards the reinforcing tab (5) connecting to the side tab (AL). This side tab (AL) has a "U" shape and is around the reinforcing tab (5), and its curved portion presents the side sealing area (VL).

The inner, rear, outer and isolating walls (1,2,3,6) form a tubular area. Such tubular area is called the work span (8), which is an area for screw accommodation, nut installation and other auxiliary fastening items that may be necessary to the electrical cabinet assembly.

The inner, rear, outer and oblique walls (1, 2, 3 and 4) have a plurality of fastening means (10), which are preferably holes, which can be square, rectangular, circular or even a combination thereof; additionally, said holes can have a deep draw (101) to improve the fixation due to the increase of the threading area.

In an embodiment of the present invention, the side tab (AL) is removed. In this form of construction, the outer wall (3) is connected directly to the isolating wall (6) and the oblique wall (4) touches one of its ends near the edge formed between said outer wall (3) and isolating wall (6). In this embodiment, the end of the oblique wall (4) is preferably welded, and said end may contain cutouts (11) to facilitate the welding process. In this embodiment, the side sealing area (VL) is on the outer wall (3), which does not have fastening means (10), being fully closed.

In an embodiment of the present invention, the isolating wall (6) may have a deflection (61) before touching the inner wall (1).

In a preferred embodiment of the present invention, the profile (P) is constructed of a single folded sheet.

In an embodiment of the present invention, the internal work span (8) is a quadrilateral with right angles, that is, a square or rectangle.

The profile (P) can provide total isolation between the internal areas (AI) and external areas (AE) through the sealing areas (VF and VL), isolation wall (6) and the initial crimping tab (7).

The overlap that occurs with front tab (AF) and the initial crimping tab (7), forming a triple layer, and the also referred initial crimping tab (7) and the junction wall (9), forming a double layer, improve and guarantee the sealing in addition to promoting structural reinforcement in the profile (P). Such structural reinforcement allows profile (P) to be built with reduced width, occupying a smaller area in the cabinet, which provides a greater useful area for the components to be assembled. Such an increase in useful area is substantially perceived when using several cabinets or the need for several profiles to assemble a cabinet.

The profile (P) arrangements presented here are able to provide an easy assembly for an electrical cabinet or panel, in addition to provide total isolation between internal and external areas, providing, thus, greater safety.

The present invention also stands out for the possibility of construction with or without the need for welds, eliminating process steps and consequently reducing production cost.

Profile (P) conception was specifically designed with the objective of using it in electrical cabinet assembly, thus allowing the fulfillment of short circuit requirements, especially the requirements of Ingress Protection IP54.

It should be understood that the present specification does not limit the application to the details described herein and the invention is capable of other embodiments and should be practiced or performed in a variety of ways, within the scope of the claims. Although specific terms have been used, these terms should be construed in a generic and descriptive sense, and not for the purpose of limitation.

The invention claimed is:

1. A profile for an electrical cabinet comprising:
   a side sealing area and, positioned in relation to it at about 90°, a front sealing area;
   an inner wall;
   a rear wall;
   an outer wall;
   an oblique wall; and,
   an isolating wall;
   wherein the outer wall is connected to the isolating wall, forming an angle of 90°, the isolating wall extends towards the inner wall until an end of the isolating wall touches the inner wall, wherein the isolating wall extends towards the inner wall and includes a deflection portion that deflects at an angle toward the inner wall, the profile further comprising an initial crimping tab connected to the isolating wall at the end that touches the inner wall;
   wherein the initial crimping tab extends from the isolating wall and substantially parallel to a junction wall, the junction wall formed as an extension of the inner wall, and the profile further comprising a front tab having a substantially "U" shape with an inner side and outer side that forms a curved portion around a free end of the initial crimping tab and forming the front sealing area, the inner side of the front tab is connected to the junction wall; and
   wherein the oblique wall is connected to and extends from the outer side of the front tab, wherein a free end of the oblique wall touches an edge formed between the outer wall and the isolating wall.

2. The profile according to claim 1, wherein the inner wall is connected to the rear wall, forming an angle of about 90° with each other.

3. The profile according to claim 1, wherein the rear wall is connected to the outer wall, the outer wall is substantially parallel to the inner wall.

4. The profile according to claim 3, further comprising a reinforcing tab connected to the outer wall, in the opposite end of the rear wall and projecting away from the inner wall; wherein said reinforcing tab bends at an angle of 180° and has a first reinforcing tab side connected to the outer wall.

5. The profile according to claim 4, wherein the reinforcing tab has a second reinforcing tab side connected to the isolating wall.

6. The profile according to claim 5, wherein the isolating wall is aligned to one of the first and second reinforcing tab sides.

7. The profile according to claim 5, wherein the isolating wall extends from the reinforcing tab towards the inner wall until they touch each other.

8. The profile according to claim 4, wherein the oblique wall extends towards the reinforcing tab and terminating at a side tab adjacent the reinforcing tab the side tab creating the side sealing area, the side tab comprises a substantially "U" shaped side portion that conforms around the reinforcing tab.

9. The profile according to claim 1, characterized in that the initial crimping tab is connected to the deflection portion of the isolating wall.

10. The profile according to claim 1, wherein the free end of the oblique wall has at least one cutout portion along a longitudinal length of the profile.

11. The profile according to claim 10, wherein the free end of the oblique wall is welded to the isolating wall along each cutout portion.

12. The profile according to claim 1, wherein the side sealing area is in the outer wall.

13. The profile according to claim 1, wherein the inner wall, the rear wall, the outer wall and the isolating wall form a work span in their interior.

14. The profile according to claim 1, wherein the inner wall, the rear wall and the outer wall present a plurality of holes configured to receive a fastener, the plurality of holes are a combination of square, rectangular and circular holes and the plurality of holes present a deep draw.

15. The profile according to claim 1, wherein the profile is formed in a single folded sheet.

* * * * *